United States Patent [19]

Ross

[11] Patent Number: 4,462,048
[45] Date of Patent: Jul. 24, 1984

[54] NOISE REDUCTION CIRCUITRY FOR AUDIO SIGNALS

[75] Inventor: Michael D. Ross, Somerdale, N.J.

[73] Assignee: RCA Corporation, New York, N.Y.

[21] Appl. No.: 348,025

[22] Filed: Feb. 11, 1982

[51] Int. Cl.³ .............................................. H04N 5/76
[52] U.S. Cl. .................................... 358/336; 358/342; 369/61
[58] Field of Search .................. 369/61; 358/314, 336, 358/342; 360/38.1; 455/205

[56] References Cited

U.S. PATENT DOCUMENTS

| | | | |
|---|---|---|---|
| 3,463,874 | 8/1969 | Hodge et al. | |
| 3,783,307 | 1/1974 | Breuer | 307/243 |
| 3,925,605 | 12/1975 | Rennick | 358/336 |
| 3,989,893 | 11/1976 | Eisema | 358/336 |
| 4,012,774 | 3/1977 | Kuniyoshi et al. | 358/314 |
| 4,119,812 | 10/1978 | Fox . | |
| 4,178,552 | 12/1979 | Amazawa et al. | 325/479 |
| 4,203,134 | 5/1980 | Christopher et al. | 358/336 X |
| 4,221,930 | 9/1980 | Okuno . | |
| 4,245,262 | 1/1981 | Ohtsu | 358/314 X |
| 4,323,934 | 4/1982 | Giraud | 369/61 |
| 4,364,119 | 12/1982 | Gibson | 358/336 X |
| 4,398,219 | 8/1983 | Yasuda | 358/336 X |

OTHER PUBLICATIONS

C. H. Séquin and M. F. Tompsett, *Charge Transfer Devices*, Chap. 5, Academic Press Inc., N.Y., 1975.

Primary Examiner—Donald E. McElheny, Jr.
Attorney, Agent, or Firm—E. M. Whitacre; P. J. Rasmussen; E. P. Herrmann

[57] ABSTRACT

A signal substitution system is employed in audio processing circuitry to compensate for impulse noise and signal dropouts. Stored or delayed audio signal is substituted in the IF portion of the receiver circuitry ahead of the IF filters thereby precluding the noise impulses from exciting the filters into a ringing mode and significantly broadening what are otherwise very narrow signal disturbances. To insure that the substitution signal is in relative phase coherence with the substituted signal, the substitution signal is delayed an integral number, N, of cycles of the audio carrier. The number N is chosen to be small, resulting in the change in the modulating signal corresponding to the stored portion of the carrier being small. The affect on the baseband signal is that during instances where defects occurred the signal appears to have been sampled and held, but the duration is so short that they are not audibly distinguishable.

13 Claims, 4 Drawing Figures

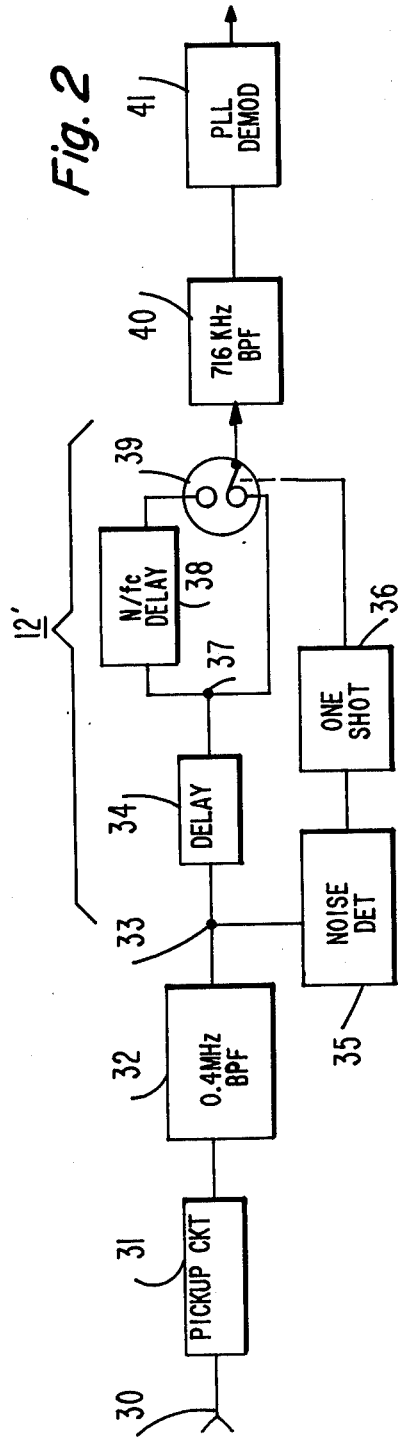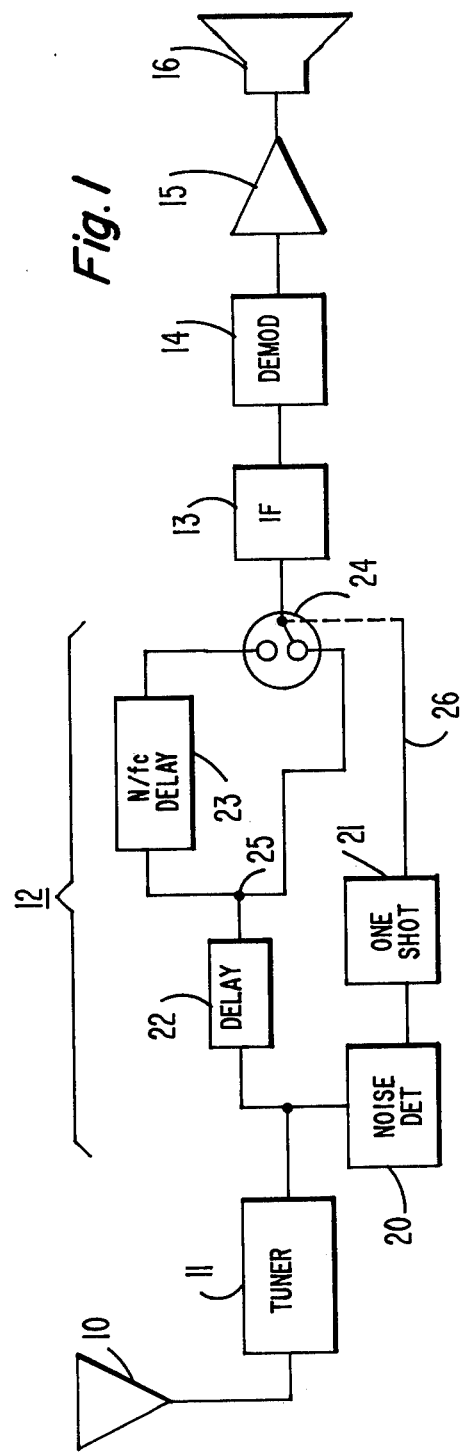

NOISE REDUCTION CIRCUITRY FOR AUDIO SIGNALS

BACKGROUND

This invention relates to audio circuitry and more particularly to circuitry for reducing electrical noise which produces undesirable and annoying ticks and pops, etc. in reproduced sound.

Audio signals which are broadcast or recorded as for example on a video disc are transmitted/recorded in the form of a modulated carrier. During transmission or recording/recovery the signal will typically have imposed thereon electrical noise in the form of impulses or suffer periods where the signal is lost entirely, e.g., "drop outs". The impulses or dropouts generate undesirable disturbances in the reproduced sound signals.

It is known to reduce the affects of electrical noise by limiting the signal bandwidth and/or limiting signal amplitude to a predetermined threshold. The affects of signal dropouts have been reduced by detecting the occurrence of a drop out and holding the baseband audio signal constant at a level equal to the signal level occurring immediately prior to the dropout for the duration of the dropout, see for example U.S. Pat. No. 4,221,930 entitled, "FM Defect Compensation Apparatus" issued to Y. Okuno.

Typically, noise reduction in audio systems is performed on the baseband signal. It has been found, however, that what start out as very narrow noise pulses (e.g., 2 μsec) in the RF section of a receiver/player may ultimately be manifested as a much longer (e.g., 20 μsec) disturbance in the reproduced sound. This occurs due to fast noise pulses causing ringing in for example the IF filter section. It should be appreciated that an impulse noise disturbance in the signal is expanded to equal the duration of such ringing. Thus, it is advantageous to perform noise reduction at the RF section of the receiver/recovery apparatus before such noise expansion occurs.

K. Amazawa et al. in U.S. Pat. No. 4,178,552 describe a "Noise Eliminating Circuit" which comprises an oscillator to track and generate a signal having a frequency equal to the modulated carrier frequency, which generated signal is substituted for the carrier when the carrier contains noise. This apparatus, however, does not have facility to adapt to changing carrier amplitudes, thus switching between the received carrier and the generated signal may itself create disturbances in the reproduced sound.

The present invention substitutes delayed signal for noisy real time signal. It is noted that a similar technique has been utilized to eliminate noise/dropouts in recorded video signals for many years, see for example U.S. Pat. No. 3,463,874. These systems however rely on the fact that video signals are highly redundant line-to-line so that substitution of signal from an adjacent line will correlate closely with the substituted signal. Audio signals on the other hand generally are not correlated with any predictable regularity. The present inventor realized that substitution of a short segment, e.g., 1-2 μsec. of the RF audio signal with an adjacent segment of RF signal can be considered analogous to sampling and holding the signal for a brief period. Therefore, as long as the substitution periods are relatively short compared to the minimum sound signal wavelength, correlation of the substitution signal with the substituted signal is inconsequential. For a given noise impulse, the substitution (i.e., holding) period required in the RF section is significantly less than the sample and holding period required at baseband, thus the signal substitution system in the RF stages generally enhances ultimate system response.

SUMMARY OF THE INVENTION

The present invention reduces the affects of electrical noise by substituting recovered signal delayed an integral number of carrier wavelengths in the RF portion of the receiver/recovery apparatus for real time signal having noise thereon. The circuitry comprises a defect detector connected for receiving RF signal to generate control signals responsive to noise impulses/dropouts in the received signal. An analog delay line is connected for receiving the received RF signal and producing an output signal delayed by N/f carrier seconds. A switch responsive to the control signals selectively applied the delayed signal in place of the real time signal to further circuitry such as an IF filter or signal demodulator.

BRIEF DESCRIPTION OF THE DRAWINGS

FIG. 1 is a block diagram of an AM radio receiver incorporating a signal substitution circuit embodying the present invention between the RF and IF sections;

FIGS. 2 and 3 are block diagrams of video disc play circuitry including signal substitution circuitry embodying the present invention in the audio processing channels.

DETAILED DESCRIPTION OF THE INVENTION

Figure 3:
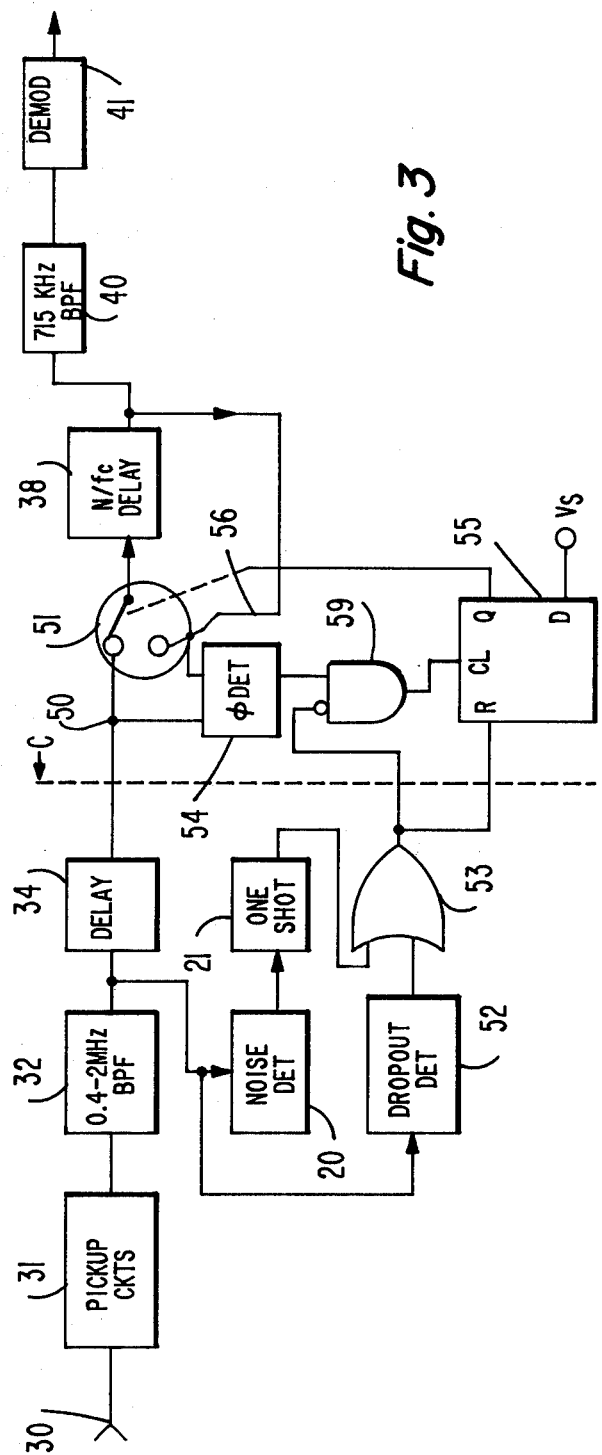

FIG. 1 illustrates in block diagram form a typical radio frequency receiver which is modified for inclusion of noise reduction circuitry. The receiver may be either AM or FM, however, different design constraints will be imposed on the signal delaying element 23 depending on the type of system.

Generally the receiver (AM or FM) includes a receiving antenna 10 which delivers RF signals to an RF input section 11 including a tuner. The tuner 11 down converts the modulated broadcast carrier to a modulated intermediate frequency carrier or IF signal—the IF signal having thereon impulse noise components attendant the broadcast carrier. The RF input-tuner section 11 is relatively broadband resulting in the noise components being translated into the IF signal substantially unchanged. In the conventional receiver the IF signal is then filtered and amplified in the IF circuitry 13. The output of the IF circuitry is demodulated to baseband in demodulator or detector 14, the baseband signal then being conditioned in power amplifier 15 and reproduced by a speaker system 16.

The IF filters 13 are sharp cut off and relatively narrow band filters with a center frequency typically located about 455 KHz. Sharp noise spikes (impulses) applied to such filters tend to excite the filters into resonance producing a ringing signal at the center frequency of the filter. The duration of the ringing is related to the filter bandwidth and may be far in excess of the duration of the exciting impulse (e.g., for a bandpass filter the ringing lasts for approximately the reciprocal of one half the filter bandpass). As a result the demodulator will produce a disturbance in the baseband signal having a duration at least as long as the ringing.

Circuitry 12 interposed between the RF and IF sections of the receiver extracts the impulses in the IF signal before it is applied to the IF circuitry in order to limit the ultimate signal disturbance to a period which is no longer than a few cycles of the IF carrier.

A noise detector 20 responsive to impulse noise in the IF signal triggers a monostable multivibrator (one shot) 21 to generate a control pulse of a predetermined period. The period of the control pulse will nominally be determined by the statistical average of the duration of the widest impulses regularly imposed on the broadcast signal. There will be some obvious trade off between the desirability of eliminating substantially all of the noise impulses and allowing the wider more infrequent noise impulses to pass into the IF section of the circuitry. (For an example of noise detecting circuitry, see U.S. Pat. No. 4,178,552.)

The control pulses produced by one shot 21 control the switch 24 to selectively apply real time signal on connection 25 or delayed signal from circuitry 23 to the IF circuitry 13. In the FIG. 1 arrangement, real time signal is normally applied to the IF section. Since the noise detector 20 and one shot 21 require a finite time to respond to noise attendant the signal exiting the RF section, a delay circuit 22 is interposed between the switch 24 and the output of the RF section 11. This delay 22 precludes the noise impulse being applied to the switch before the noise detection circuitry can activate the switch to substitute delayed signal. On the other hand if the circuit normally applied delayed signal from circuit 23 to the IF section and substituted real time signal therefore when noise impulses occurred, then the delay circuit 22 would be replaced by a direct connection between connection 25 and RF circuitry 11. However, in this instance it may be necessary to include some delay in the Noise detection—one shot circuit path depending on the response time of the circuit elements 20 and 21.

Delay element 23 is designed to delay the signal by an integral number (N) of cycles of the IF carrier $f_c$. If the received signal is amplitude modulated (AM) the carrier signal at the input and the output of the delay circuit 23 will be in phase and thus the delayed substitution signal will be in phase with the real time signal. Signal substitution therefore does not affect the integrity of the IF carrier phase or frequency. The only signal parameter which may differ between the real-time and the substitution signal is the amplitude. Considering that the IF carrier frequency is nominally an order of magnitude greater than the highest audio modulation frequency and that the number of cycles N by which circuit 23 delays the signal is small, the change in carrier amplitude will generally be sufficiently small that no noticeable disturbance will occur in the reproduced sound. The length of delay $N/f_c$ is at least as long as the widest noise impulse to be eliminated. Assume for example that the widest noise impulse is 6 $\mu$sec and the IF carrier is 455 KHz. Each cycle of the carrier is 2.2 $\mu$sec, thus a delay of exactly three cycles of the carrier will contain signal of sufficient duration of substitute for a 6 $\mu$sec impulse. (Note that the width of the control pulse produced by one shot 21 should not be longer than the delay provided by circuit 23.)

Consider the situation where the received signal is frequency modulated (FM). In this instance, the phase and frequency of the received signal is continuously changing with respect to the carrier. Regardless of whether or not the delay is an integral number N of cycles of the carrier $f_c$, the phase of the delayed signal will be different from the phase of the real time signal except perhaps for the case where the modulation is a constant tone which modulates the carrier at an even sub-multiple of the center frequency. However, if the delay provided by circuit 23 is an integral number N of carrier cycles $f_c$, the maximum phase deviation between delayed and real time signal is established with respect to the maximum frequency deviation of the FM signal, and not, in general, with respect to the noise impulse duration. It will be appreciated that the narrower the noise impulses the fewer number of cycles of delay that are necessary, which may be considerably less than the allowed maximum. If N is kept small then the amount of phase deviation between real time and delayed signal can be constrained to an amount which will not adversely affect the FM demodulator. The delay is made an integral number of carrier cycles so that phase delay will be symmetrical with respect to modulation frequency deviation both above and below the center frequency.

The delay circuit 23 may be realized with passive elements as is known in the electrical arts or it may be realized using charge transfer devices such as bucket brigade or charge coupled delay lines (see Sequin and Tompsett, *Charge Transfer Devices*, Chapter VI, Academic Press 1975).

The switch 24 may be realized by a first transistor connected between delay line 23 and the IF circuits 13 and a second transistor connected between connection 25 and the IF circuits 13, which transistors are caused to conduct alternatively to the exclusion of the other. For an alternative type of analog switching circuitry, see U.S. Pat. No. 3,783,307.

Figure 4:
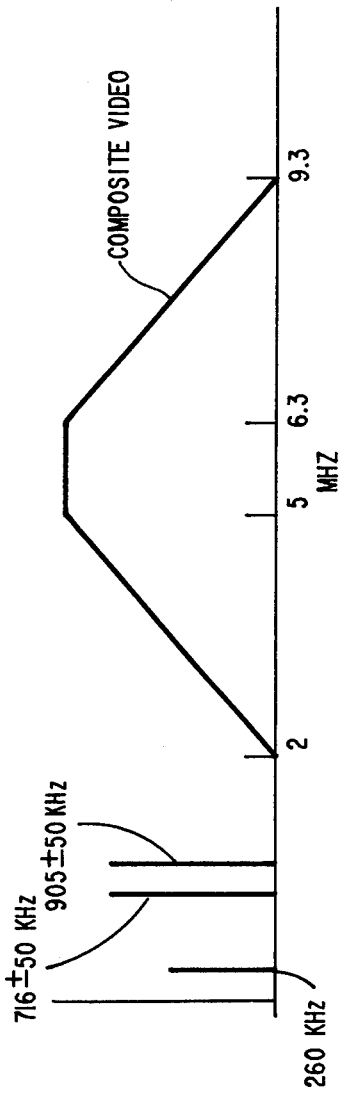
FIG. 4 is a graph of the frequency spectrum of recovered signal for the video disc system employing the FIGS. 2 and 3 circuitry.

FIG. 2 illustrates in block diagram a portion of the signal recovery circuitry for a particular video disc player incorporating a defect substitution circuit 12' connected serially in the audio processing channel. Signal recovered from a recorded disc record (not shown) is applied at terminal 30 to player pickup circuitry 31. The output signal (absent impulse noise) from circuitry 31 exhibits the frequency spectrum illustrated in FIG. 4. The signal includes composite video extending from 2 MHz to 9.3 MHz, a constant frequency tone at 260 KHz which is used by the stylus position servo system and two FM audio carriers at 716 KHz and 905 KHz for a recording with stereo sound, or a single FM carrier at 716 KHz for a recording with monaural sound. The FIG. 2 circuitry is arranged to process the latter single carrier but may be expanded to accommodate stereo signals by adding a parallel 905 KHz circuit channel connected at connection 37 and arranged similar to elements 38, 39, 40 and 41.

The signal from circuit 31 is normally applied to the narrow band, 716 KHz audio bandpass filter 40 which extracts only the 716 KHz audio carrier for application to the phase locked loop FM demodulator 41. The recovered signal includes noise impulses of duration predominantly less than or equal to 2 $\mu$sec, which impulses tend to excite the 716 KHz bandpass filter 40 into a ringing mode of approximately 16 $\mu$sec duration.

The ringing of filter 40 interrupts the normal operation of demodulator 41 causing it to lose phase lock which in turn produces anomalous disturbances in the demodulated base band audio signal. These disturbances may exceed the 16 $\mu$sec ringing time of the filter 40. Circuit elements 32 and 12' are interposed between the pickup circuitry 31 and the bandpass filter 40 to eliminate these pulses by signal substitution as described in the foregoing. The prefilter 32 having a bandwidth from 0.4—2 MHz generally selects out the 716 KHz audio carrier from the composite recovered signal but is sufficiently broadband not to significantly alter the character of the noise impulses on the audio signal. The 260 KHz tone and the video signal are substantially attenuated by the filter.

The delay of the delay element 38 is exactly 3 cycles of the 716 KHz FM carrier or approximately 4.2 μsec which is more than sufficient to eliminate the 2 μsec. noise impulses by delayed signal substitution. It can be shown that for a maximum carrier deviation of (±) 50 KHz (the system carrier frequency modulation) the maximum phase delay that can occur between the real time and delayed signal is 72 degrees. However for the majority of audio signals used to modulate the carrier the phase difference will be substantially less than 72 degrees. Considering that the phase jump is always less than 90 degrees and that the 716 KHz filter 40 will have some smoothing affect on the waveform, the demodulator should not fall out of phase lock upon being subjected to the maximum phase shift which may be produced in the delay element 38.

FIG. 3 is a further variation on the FIG. 2 video disc audio signal substitution circuit which permits signal substitution of noise signals, i.e., dropouts, of duration in excess of the delay time of the circuit delay element. In this instance delayed signal is recirculated in the delay element, and applied to the bandpass filters until the noise disturbance abates.

Referring to FIG. 3, circuit elements having the same designation numerals as the FIG. 2 circuit elements perform similar functions. The noise detection and control signal generation circuitry 20 and 21 is supplemented with a dropout detector 52 which detects the absence of signal. An example of a dropout detector is described in U.S. Pat. No. 4,119,812. The output control signals from detector 52 and one shot 21 are ORed together in the two-input OR gate 53. The output terminal of OR gate 53 is applied to the reset input terminal of "D" type flip flop 55 (e.g., and RCA Corp. CD 4013 COS/MOS Dual D Flip Flop) having a $\overline{Q}$ output terminal connected for controlling switch 51.

In the FIG. 3 arrangement the modulated audio carrier from bandpass filter 32 is delayed in circuit 34 which delays the signal sufficiently so that impulse noise or dropouts do not arrive at switch 51 ahead of the control signal from flip flop 55. In normal operation switch 51 applies signal from delay element 34 to the input terminal of delay element 38. Output signal from delay element 38 is applied to the bandpass filter 40. On the occurrence of a noise impulse or signal dropout, switch 51 connects the input terminal of delay element 38 to the output terminal of delay element 38 causing the signal contained in the delay element 38 at the time of switching to recirculate therein and be reapplied to the filter 40. Because the signal is recirculated and noise impulses are precluded from advancing along the signal path when the system is operating in the recirculate mode, it may be desirable to hold the switch in the recirculate position during the occurrence of a sequence of closely spaced noise impulses. To accomplish this effect the one shot 21 is made retriggerable, i.e., if a successive trigger pulse from detector 20 is produced while the one shot is outputting a control pulse, the output control pulse is extended for an additional period. Assuming that the signal is frequency modulated, the maximum phase difference between the real time signal at connection 50 and the delayed signal at connection 56 will be some value $\Delta\phi$ dependent on the delay time $N/f_c$, which is designed to be sufficiently small so as not to undesirably affect the demodulator 41. If this condition is satisfied switch 51 may switch from real-time signal to delayed signal at anytime without affecting the demodulation process, e.g., the switching will not cause a PLL demodulator to lose lock. Note however that for the signal segment being recirculated once, the phase difference between the real-time and delay signal is 2 $\Delta\phi$ and if it is recirculated R times the maximum phase difference will approach $(R+1)\Delta\phi$. It should be appreciated that unless the phase delay produced by delay element 38 is relatively small, real time signal cannot be arbitrarily reapplied to the delay element 38 at an arbitrary time without the possibility of disturbing the demodulator performance. Therefore, a phase detector is utilized to measure the relative phase between the real-time and delayed signal. Reapplication of the real-time signal to delay element 38 input terminal is performed only when the phase difference is within the range which will not undesirably affect the demodulators.

In the circuit a phase detector 54 has a first input terminal connected to connection 50 for receiving real-time signal and a second input terminal connected to connection 56 or receiving delayed signal. The output of the phase detector is applied through AND gate 59 to the clock input of "D" flip flop 55. When a control pulse is present at the output of OR gate 53 flip flop 55 is reset with its $\overline{Q}$ output caused to go to a "high" state. The control signal at the OR 53 output is also applied to AND gate 59 to inhibit output signal from phase detector 54 affecting flip flop 55. When the control signal is extinguished, AND gate 59 is enabled permitting the output of the phase detector to apply a signal to the clock input terminal of flip flop. With supply potential applied to the "Data" (D) input terminal of the flip flop, the "$\overline{Q}$" output will return to a low state simultaneously with the application of a signal to the clock input. "High" and "Low" $\overline{Q}$ output states are presumed to cause the switch 51 to apply delayed or real-time signal to the delay element 38 input terminal respectively.

The phase detector 54 may be either analog or digital since the audio signal is an FM waveform and may be amplitude limited to produce a digital like signal. In the latter case the phase detector may be an EXCLUSIVE OR circuit with a low pass filter connected at its output terminal, of the type utilized in the RCA Corp. CD4046 CMOS PHASE LOCKED LOOP circuit.

The FIG. 3 circuit may also be modified to accommodate stereo signals by addition, in this case, of a parallel 905 KHz channel connected at connection 50. The 905 KHz channel would duplicate the circuitry on the right hand side of the broken line "C" with the provision that the delay element, the bandpass filter and the demodulator be designed to process the 905 KHz carrier. The output from OR gate 53 may be used to activate the respective switches in both channels, however, separate phase detectors must be employed to extinguish the control signals applied to the respective switches.

What is claimed is:

1. Circuitry for compensating defects in an audio signal, which signal is in the form of a carrier modulated by an audio signal, said circuitry comprising:
   means for delaying said modulated carrier by an integral multiple of carrier cycles;
   means for detecting the occurrence of defects in the modulated carrier and generating control pulses responsive thereto; and
   switch means responsive to said control pulses for substituting the delayed modulated carrier for defects in the nondelayed modulated carrier.

2. In a circuit of the type for processing signals in the form of a carrier modulated by an audio signal, said modulated carrier signal being subject to defects therein, said circuit including a demodulator for recovering the modulation signal from said carrier, said circuit further including defect compensation circuitry comprising:
   a defect detector responsive to the modulated carrier signal for producing control signals upon the occurrence of signal defects;
   delay means responsive to the modulated carrier signal for delaying the modulated carrier signal by a time substantially equivalent to an integral number of carrier signal cycles; and
   switch means serially connected in the demodulator circuit and responsive to said control signals for applying one of undelayed modulated carrier signal and delayed modulated carrier signal from the delay means to said demodulator in the absence of said control signals and applying the other of said undelayed modulated carrier and the delayed modulated carrier signals from said delay means during the presence of said control signals.

3. The circuitry set forth in claim 2 wherein the defect detector includes circuitry for producing control signals of predetermined duration.

4. The circuitry set forth in claim 2 or 3 wherein the delay means provides a signal delay time equal to three times the reciprocal of the carrier center frequency.

5. A receiver for reproducing audio signals comprising:
   a tuner for downconverting FM broadcast signals to an IF signal;
   a defect detector responsive to defects in the IF signal for generating control signals;
   delay means responsive to the IF signal for delaying said IF signal by a time substantially equivalent to an integral number of IF carrier cycles;
   an IF narrow band filter having an output terminal coupled to sound reproduction apparatus; and
   switch means responsive to said control signal for applying the delayed IF signal from the delay means to said IF filter and for applying the undelayed IF signal to said IF filter otherwise.

6. The receiver set forth in claim 5 wherein said defect detector includes circuitry for producing control pulses of predetermined duration.

7. Defect compensation circuitry for serial inclusion in a system for processing audio signal in the form of a modulated carrier, said circuitry comprising:
   a first terminal for applying said audio signal thereto;
   control circuitry including a defect detector responsive to said audio signal, for producing control signals upon the occurrence of signal defects;
   delay means having input and output terminals, said delay means providing a signal time delay substantially equivalent to an integral number of cycles of said carrier;
   switch means for applying audio signal from the output terminal of the delay means to the input terminal of said delay means in response to said control signals and for applying audio signal from said first terminal to the input terminal of the delay means otherwise; and means for coupling the output terminal of the delay means to an output of said defect compensation circuitry.

8. The defect compensation circuit set forth in claim 7 wherein said control circuitry further includes a phase detector having first and second input terminals connected to said first terminal and the delay means output terminal, said phase detector producing an output signal only when the signals applied to its input terminals are within a predetermined limited range of phase coherence and means responsive to output signal from said defect detector for producing said control signal and responsive to said defect detector and said phase detector for extinguishing said control signal.

9. The defect compensation circuit set forth in claim 7 including a further delay means serially connected between said first terminal and said switch for producing a signal delay commensurate with the response time for the control circuitry to produce said control signal at said switch means upon application of a signal defect to said control circuitry.

10. A video disc player of the type for receiving a composite signal including at least one relatively low frequency carrier modulated by an audio signal and a relatively high frequency video carrier, including a signal pickup device cooperating with pickup circuitry to produce an electrical manifestation of said composite signal and including further circuitry comprising:
    a first band pass filter responsive to said composite signal for passing said at least one modulated low frequency carrier substantially to the exclusion of the video carrier, said band pass filter being sufficiently broad band to pass impulse noise attendant the recovered signal without being excited into ringing;
    a defect detector responsive to the at least one modulated low frequency carrier for generating control signals upon detecting defects in said at least one low frequency carrier signal;
    delay means having input and output terminals respectively, said delay means delaying at least one modulated low frequency carrier signal by a time substantially equivalent to an integral number of cycles of said low frequency audio carrier;
    switch means responsive to said control signals for connecting the delay means input terminal to the delay means output terminal and for connecting the delay means input terminal for receiving signal from said first band pass filter otherwise; and
    a second relatively narrow band, bandpass filter tuned to said at least one low frequency carrier frequency having an input terminal connected to the delay means output terminal and having an output terminal at which a defect corrected low frequency modulated carrier is available.

11. The video disc player set forth in claim 10 wherein said first bandpass filter has a band pass from 0.4 MHz to 2 MHz.

12. The video disc player set forth in claim 10 wherein the defect detector includes means to detect noise impulses and means to detect signal dropouts.

13. The video disc player set forth in claim 10 further including a phase detector for producing a further signal only when the two signals alternatively applied to the input of the delay means are within a predetermined range of phase coherence; and
    means responsive to said further signal precluding said control signals being extinguished except when said further signal is produced.

* * * * *